(12) United States Patent
Chindalore (10) Patent No.: US 7,745,344 B2
(45) Date of Patent: Jun. 29, 2010

(54) METHOD FOR INTEGRATING NVM CIRCUITRY WITH LOGIC CIRCUITRY

(75) Inventor: Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 260 days.

(21) Appl. No.: 11/926,348

(22) Filed: Oct. 29, 2007

(65) Prior Publication Data

US 2009/0111226 A1 Apr. 30, 2009

(51) Int. Cl.
*H01L 21/302* (2006.01)

(52) U.S. Cl. .............. 438/738; 438/401; 257/E21.023

(58) Field of Classification Search ............... 257/252, 257/288, 314, 410; 438/14, 258, 700, 239
See application file for complete search history.

(56) References Cited

U.S. PATENT DOCUMENTS

| 6,271,143 | B1 * | 8/2001 | Mendicino ............ 438/700 |
|---|---|---|---|
| 6,410,949 | B2 | 6/2002 | Wang et al. |
| 6,509,235 | B2 | 1/2003 | Chien et al. |
| 6,559,059 | B2 | 5/2003 | Chien et al. |
| 6,706,593 | B1 | 3/2004 | Kodama |
| 6,707,079 | B2 | 3/2004 | Satoh et al. |
| 6,875,622 | B1 * | 4/2005 | Markle ............ 438/14 |
| 6,964,902 | B2 | 11/2005 | Steimle et al. |
| 7,151,302 | B1 | 12/2006 | Chindalore |
| 2004/0075133 | A1 * | 4/2004 | Nakagawa et al. ...... 257/314 |
| 2004/0124450 | A1 | 7/2004 | Yeap et al. |
| 2007/0051952 | A1 * | 3/2007 | Yamazaki et al. ......... 257/59 |

FOREIGN PATENT DOCUMENTS

KR   10-2001-0027375 A   4/2001

OTHER PUBLICATIONS

PCT/US2008/076750 International Search Report and Written Opinion mailed Apr. 10, 2009.

* cited by examiner

*Primary Examiner*—Thanh V Pham
*Assistant Examiner*—Mark A Laurenzi, III (57) ABSTRACT

A method for integrating Non-Volatile Memory (NVM) circuitry with logic circuitry is provided. The method includes depositing a first layer of gate material over the NVM area and the logic area of the substrate. The method further includes depositing multiple adjoining sacrificial layers comprising nitride, oxide and nitride (ARC layer) overlying each other. The multiple adjoining sacrificial layers are used to pattern select gate and control gate of memory transistor in the NVM area, and the ARC layer of the multiple adjoining sacrificial layers is used to pattern gate of logic transistor in the logic area.

10 Claims, 13 Drawing Sheets

METHOD FOR INTEGRATING NVM CIRCUITRY WITH LOGIC CIRCUITRY

BACKGROUND

1. Field

This disclosure relates generally to integrated circuit fabrication, and more specifically, to integrating Non-Volatile Memory (NVM) circuitry with logic circuitry in fabricating integrated circuit designs.

2. Related Art

In the field of integrated circuit design, System-on-chip (SoC) devices are commonly used. The term "SoC" refers to devices that integrate several types of blocks, including logic, programmable parts, I/O, volatile memory and non-volatile memory on a single integrated circuit.

Floating-gate based memories are frequently used as non-volatile memories in SoC designs. To overcome the scaling limitations of floating-gate based memories embedded on SoC, thin film storage (TFS) memories are currently being used. In a TFS memory, charge is stored in a thin insulating film consisting of silicon crystals commonly known as nanocrystals.

Integration of TFS (Thin Film Storage) memories with logic circuitry in an SoC requires two gate etches, one for a select gate in the TFS area and another for the gate of logic or peripheral transistors in the logic area. The logic or peripheral transistors are very small, having critical dimensions, and are thus complicated to pattern. In one approach, gates of tiny transistors are patterned using a bottom anti-reflective coating (BARC) layer which is deposited over the gate oxide to achieve critical dimension (CD) control of gate dimensions of the transistors. Since a BARC has high viscosity, it is difficult to deposit BARC layers. Further, the process gets more complicated if there is a difference in height between the memory area and logic area on the SoC. In addition, if the physical distance between the memory area and the logic area on the SoC is small, a very thick layer of non-planar BARC gets deposited over the gate oxide in the logic area which is difficult to etch. In addition, the patterning of a transistor gate using the thick BARC layer is a complicated process, as the thick BARC layer is too anti-reflective. To resolve this non-planarity problem, the distance between the memory area and the logic area, called isolation region, is required to be large. However, an increase in the isolation region entails layout inefficiencies in the SoC design.

Another approach for patterning a small-dimensioned transistor includes deposition of a regular anti-reflective coating (ARC) or nitride. However, it is difficult to etch it in the later processes due to the non-planarity problem.

There exists a need for a method to overcome these problems and to reduce the process complexity while integrating the NVM circuitry with the logic circuitry in the SoC.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. Elements in the figures are illustrated for simplicity and clarity and have not necessarily been drawn to scale.

Skilled artisans will appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method provides a substrate having a first defined area and a second defined area that are electrically separated from each other. In addition, the method provides a first layer of gate material overlying the substrate in both the first defined area and the second defined area. Further, the method provides multiple adjoining sacrificial layers overlying the first layer of gate material. The method further uses the multiple adjoining sacrificial layers to form transistor control electrodes in the first defined area in which at least one of the adjoining sacrificial layers is not completely removed. Additionally, the method uses one of the adjoining sacrificial layers to pattern transistor control electrode in the second defined area. Finally, the method completes formation of transistors in both the first defined area and the second defined area.

In another embodiment of the present invention, a method of forming an integrated circuit is provided. The integrated circuit includes a first region and a second region formed over a substrate and is separated by an isolation region. The method includes forming a first gate electrode material layer overlying the substrate in both the first region and the second region. Further, the method forms a plurality of sacrificial layers overlying the first gate electrode material layer in both the first region and the second region before forming any devices in the first region and the second region. In addition, the method includes using the plurality of sacrificial layers to form a first type of device in the first region. Furthermore, the method includes using the plurality of sacrificial layers to form a second type of device in the second region.

In yet another embodiment, a method of forming an integrated circuit is provided. The integrated circuit includes a memory region and a logic region formed over a substrate and separated by an isolation region. The method includes forming a first gate electrode material layer overlying the substrate in both the memory region and the logic region. The method further includes forming a plurality of sacrificial layers overlying the first gate electrode material layer in both the memory region and the logic region prior to forming any device in the memory region and the logic region. In addition, the method includes using the plurality of sacrificial layers to form a non-volatile memory device in the memory region. Also, the method includes using at least one of the plurality of sacrificial layers to form a logic device in the logic region. At least one of the plurality of sacrificial layers used to form the logic device is an anti-reflective coating (ARC) layer used to pattern a gate electrode corresponding to the logic device in the logic region.

FIGS. 1-13 illustrate a cross section of a portion of a semiconductor wafer during stages in the integration of Non-Volatile Memory (NVM) circuitry with logic circuitry, according to various embodiments of the present invention.

Figure 1:
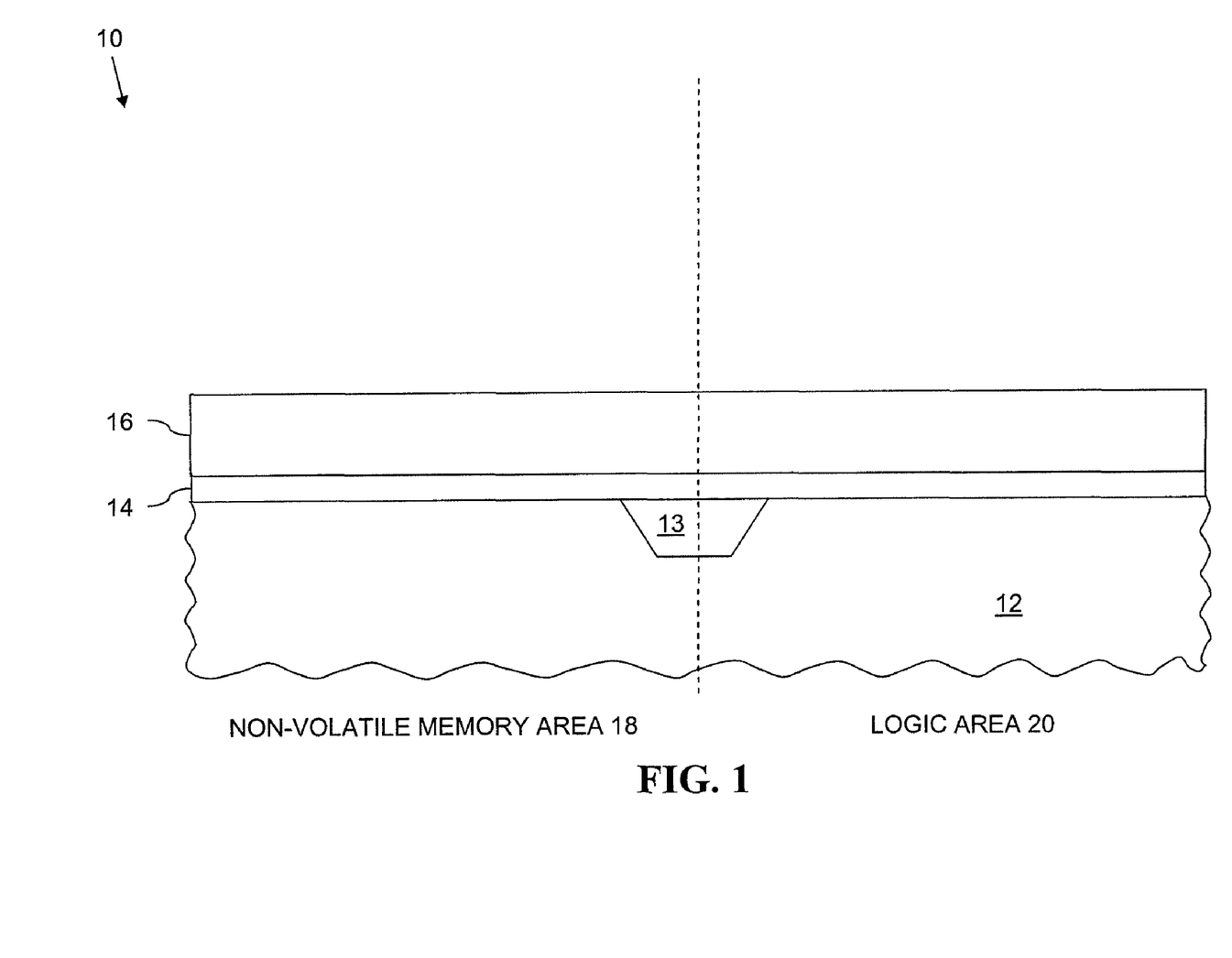
FIG. 1 illustrates a cross-section of a portion of a semiconductor device with a layer of dielectric material and a layer of gate material overlying the substrate, in accordance with an embodiment of the present invention.

Referring now to FIG. 1, the figure illustrates a cross-section of a portion of a semiconductor device 10 called an integrated circuit die. The semiconductor device 10 includes a substrate 12 having an NVM area 18 and a logic area 20 separated by a trench isolation 13. FIG. 1 shows a dielectric layer 14 and a first layer of gate material 16 overlying the substrate 12. The substrate 12 can be any semiconductor material or combination of materials, such as gallium arsenide, silicon, germanium, silicon-on-insulator (SOI), monocrystalline silicon or any other material that is conventionally used to form electronic devices. As shown in FIG. 1, the trench isolation 13 is formed on the semiconductor device 10. The trench isolation 13 is required to electrically separate a first defined area and a second defined area on the semiconductor device 10. The first defined area includes the NVM area 18, which is used for implementing non-volatile memory cells and the second defined area includes the logic area 20, which is used for implementing transistors that implement logic functions. In one embodiment of the present invention, the NVM area 18 is electrically isolated from the logic area 20 by the trench isolation 13 corresponding to a minimum photolithography limit. The trench isolation 13 can be any oxide, often referred to as trench oxide.

The dielectric layer 14 is then deposited over the substrate 12. The dielectric layer 14 can be an oxide such as silicon oxide, aluminium oxide, tantalum oxide, a nitride such as silicon nitride, titanium dioxide, and zirconium dioxide, the like and any combination thereof. The dielectric layer 14 can be deposited using conventional chemical vapor deposition (CVD) techniques, physical vapor deposition techniques, an atomic layer deposition technique, or a combination thereof.

The dielectric layer 14 can include one or more films of silicon dioxide, silicon nitride, silicon oxynitride, a high-k material (e.g. k greater than 7), or any combination thereof.

The first layer of gate material 16 is then deposited over the dielectric layer 14. The first layer of gate material 16 can be any material, such as, polysilicon, amorphous Silicon (Si), Germanium (Ge), or SiGe, the like, or any combination thereof. The first layer of gate material 16 can be deposited using a conventional chemical vapor deposition technique, or may be deposited by other processes.

In an embodiment, after completion of all the processing steps and the formation of transistors in the NVM area 18 and the logic area 20, the first layer of gate material 16 acts as a select gate for the memory transistor in the NVM area 18. The first layer of gate material 16 also acts as a gate electrode for the logic transistor in the logic area 20.

Figure 2:
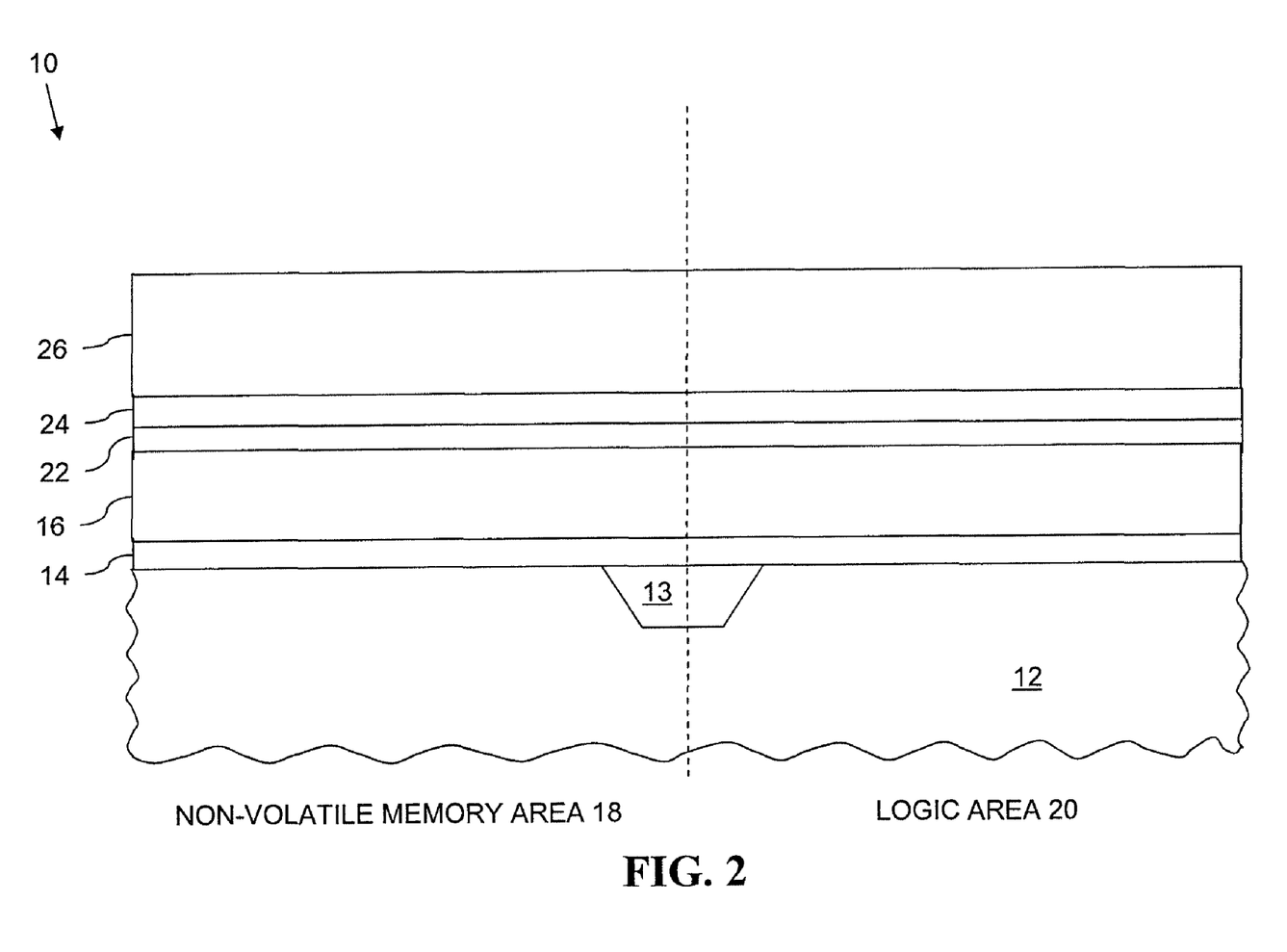
FIG. 2 illustrates the semiconductor device of FIG. 1 after depositing multiple adjoining sacrificial layers, in accordance with an embodiment of the present invention.

Referring now to FIG. 2, deposition of multiple planar adjoining sacrificial layers over the first layer of gate material 16 includes deposition of an anti-reflective coating (ARC) layer 22, an etch stop layer 24, and a polishing stop layer 26 one above another. The ARC layer 22 is formed over the first layer of gate material 16. In a preferred embodiment, the ARC layer 22 is a nitride (e.g., TiN), a metal-silicon nitride (e.g., TaaSibNc), such as silicon nitride, a metal-containing nitride, or any combination thereof. In a preferred embodiment, the ARC layer 22 is deposited using a conventional chemical vapor deposition (CVD) technique having a thickness of approximately 155 Å. The ARC layer 22 is used as an anti-reflective coating for patterning a gate of a transistor in the logic area 20.

After the ARC layer 22 is deposited, the etch stop layer 24 is formed. The etch stop layer 24, can be an oxide such as, $SiO_2$, and the like. In one embodiment, the etch stop layer 24 is an ultra-dense oxide layer (UDOX) having a thickness of 80 Å. The etch stop layer 24 is used to separate the ARC layer 22 from the polishing stop layer 26. The etch stop layer 24 is used to stop etching the polishing stop layer 26 in the etching process. Thus, the etch stop layer 24 prevents exposure of the ARC layer 22 from various processes performed during fabrication. The ARC layer 22 will be used to pattern the gate electrode of a logic transistor in the logic area 20.

In one form, the polishing stop layer 26 is deposited using CVD having a thickness of approximately five times the thickness of the etch stop layer 24. The polishing stop layer 26 can be any nitride or oxynitride, such as, SiN, SiON, and the like. The polishing stop layer 26 is used to stop polishing in chemical mechanical polishing (CMP) process. In the present invention, the polishing stop layer is used as an anti-reflective coating to pattern the select gate for the memory transistor in the NVM area 18.

In one form, the ARC layer 22 contains nitrogen, the etch stop layer 24 contains oxygen, and the polishing stop layer 26 contains nitrogen.

Figure 3:
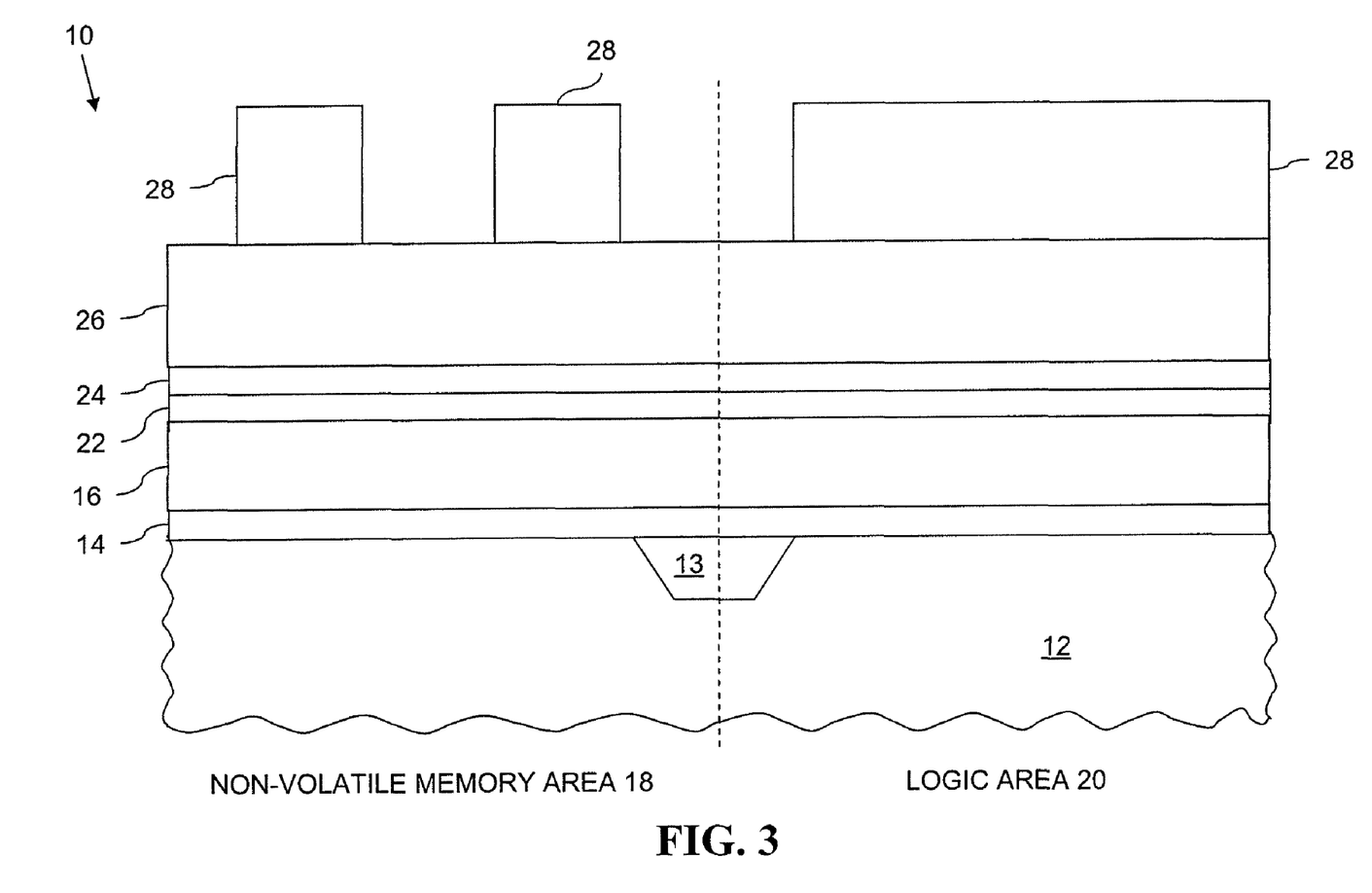
FIG. 3 illustrates the semiconductor device of FIG. 2 after depositing a patterned photoresist layer, in accordance with an embodiment of the present invention.

FIG. 3 depicts a patterned photoresist layer 28 consisting of a photoresist material deposited over the polishing stop layer 26. The patterned photoresist layer 28 is deposited using a conventional lithographic technique, for example, a spin-coating technique. The photoresist material can include a variety of photoresist chemicals suitable for lithographic applications. The photoresist material conventionally includes a matrix material or resin, a sensitizer or inhibitor, and a solvent. The material of the patterned photoresist layer 28 can be a positive photoresist material or a negative photoresist material.

Figure 4:
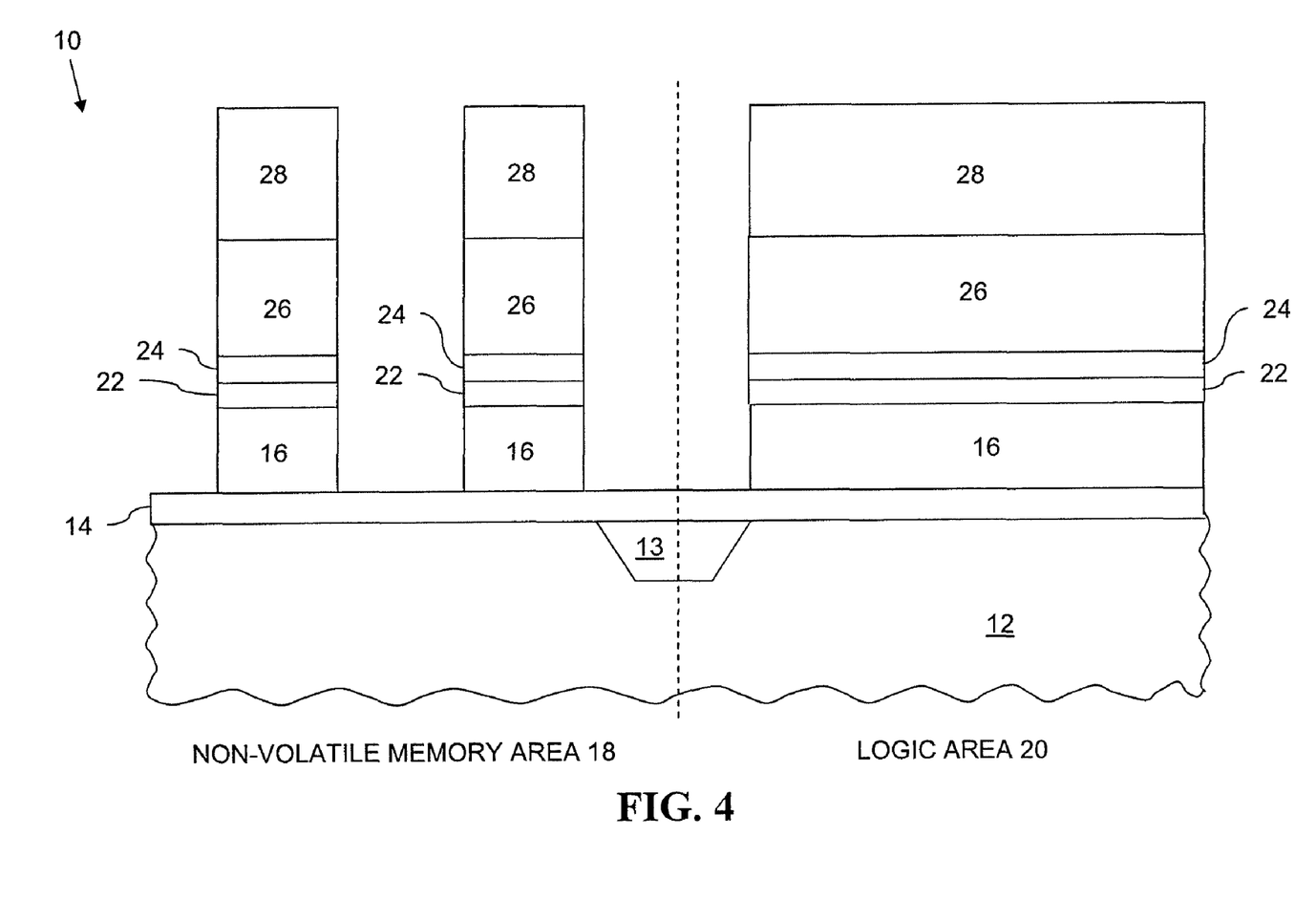
FIG. 4 illustrates the semiconductor device of FIG. 3 after etching of the sacrificial layers and the first layer of gate material, in accordance with an embodiment of the present invention.

As illustrated in FIG. 4, etching is performed using the patterned photoresist layer 28 as a mask. The etching is done to etch through the polishing stop layer 26, the etch stop layer 24, the ARC layer 22, and the first layer of gate material 16. In an embodiment, the etching is performed using a dry etch technique. The patterned photoresist layer 28 is removed following the etching process. In an embodiment, the photoresist is removed using conventional wet cleaning processes, such as, an RCA clean, a piranha clean, and the like. In another embodiment, the photoresist is removed by using conventional stripping processes, such as, ashing, solvent cleaning, and the like.

Figure 5:
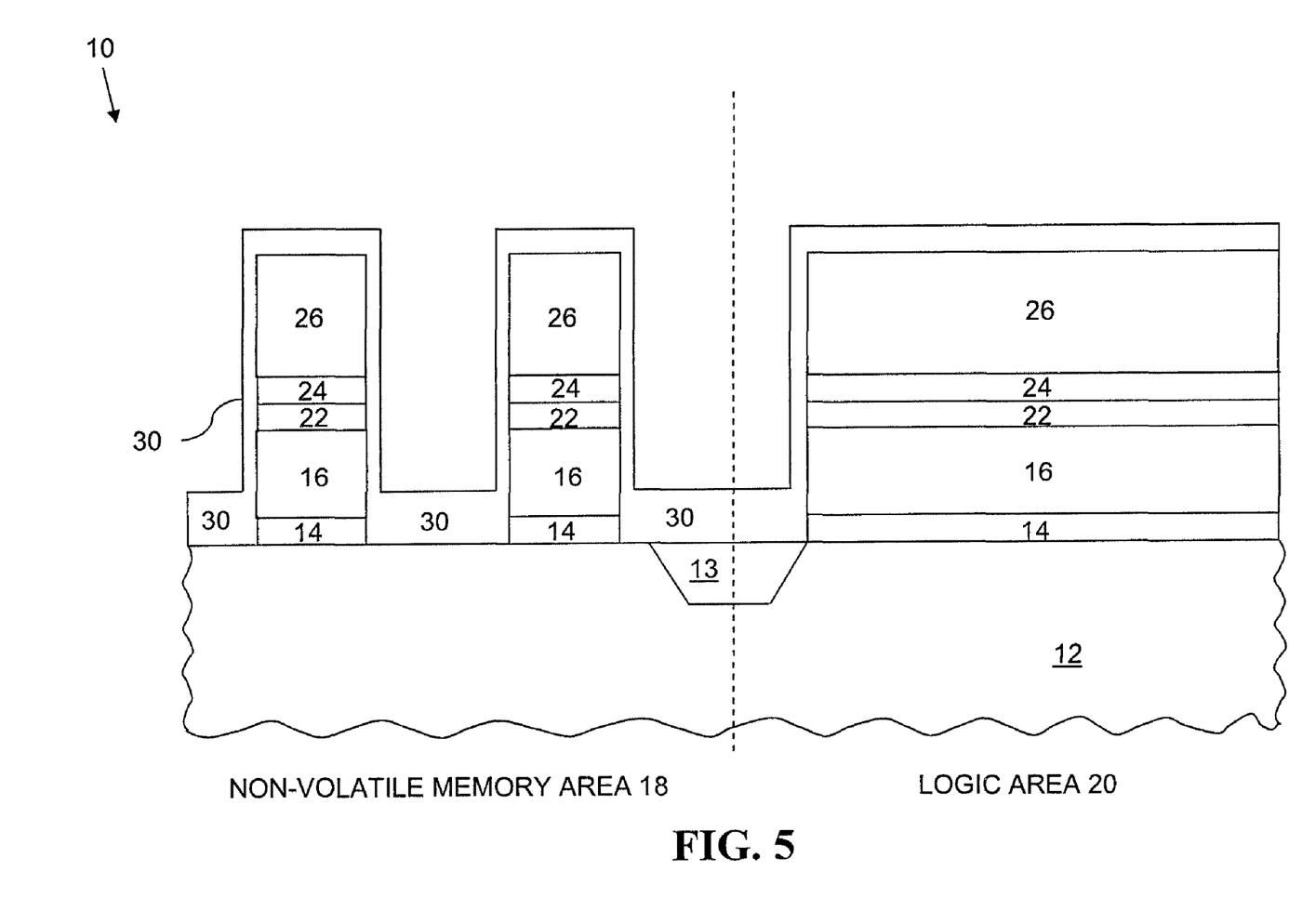
FIG. 5 illustrates the semiconductor device of FIG. 4 after the deposition of a charge storage stack above the sacrificial layers, in accordance with an embodiment of the present invention.

As shown in FIG. 5, the exposed areas of the dielectric layer 14 are etched and a charge storage stack 30 is deposited over the patterned semiconductor device 10. The charge storage stack 30 is one layer or more than one layer of charge storage material. In an embodiment, the charge storage stack 30 is deposited using conventional deposition techniques, for example, CVD, Plasma-enhanced CVD (PECVD), Low-pressure CVD (LPCVD), and the like. In one embodiment, the charge storage stack 30 is a layer of nanocrystals, sandwiched between oxides. In another embodiment, the charge storage stack 30 is a nitride sandwiched between oxides. In yet another embodiment, the charge storage stack 30 is a layer of polysilicon, followed by an oxide-nitride-oxide (ONO) layer. In a preferred embodiment, the charge storage stack 30 is a layer of nanocrystals sandwiched between oxides.

In an embodiment of the present invention, instead of depositing the charge storage stack 30 over the patterned semiconductor device 10, a polysilicon layer is deposited which acts as a floating gate for the patterned memory transistor of the NVM area 18.

Figure 6:
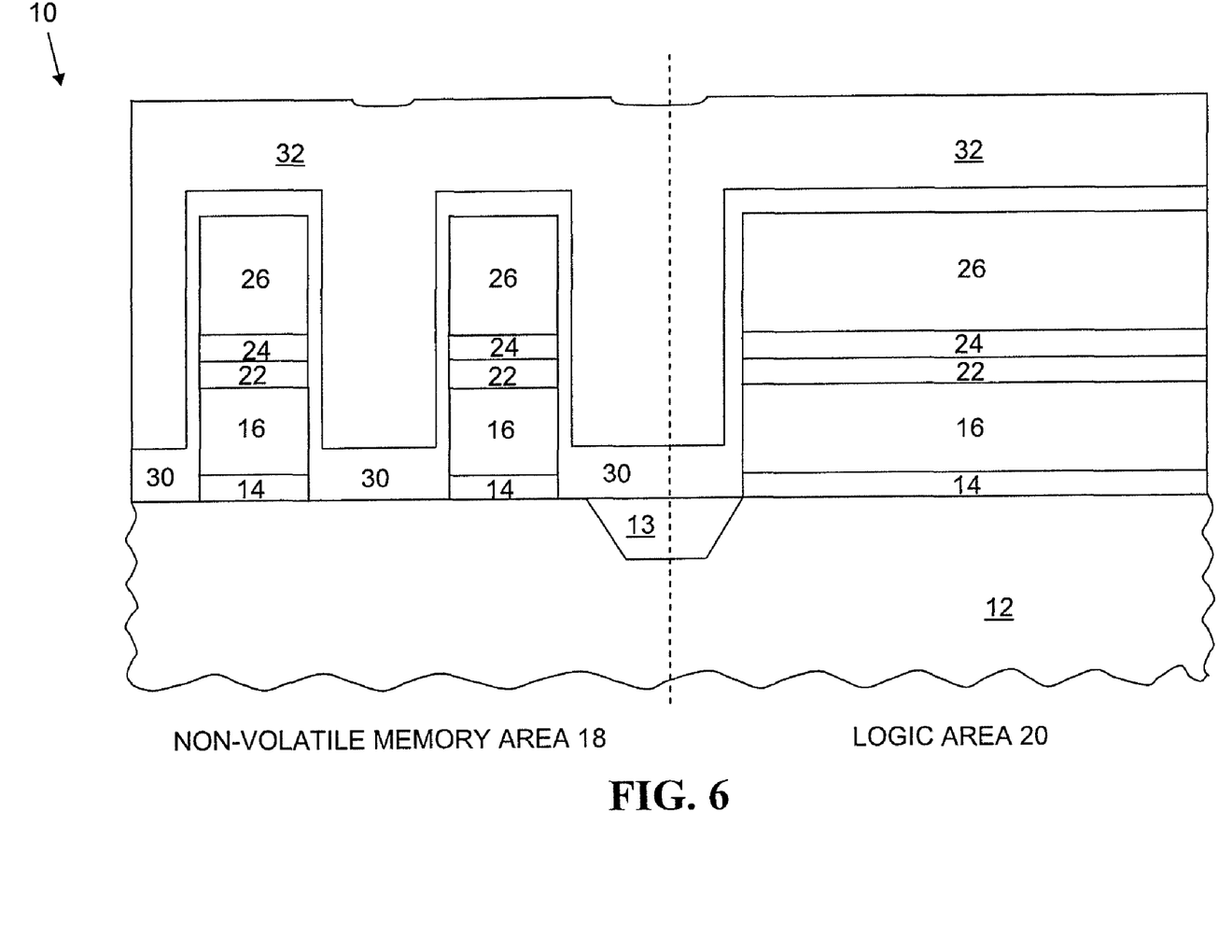
FIG. 6 illustrates the semiconductor device of FIG. 5 after depositing a second layer of gate material, in accordance with an embodiment of the present invention.

Referring to FIG. 6, a second layer of gate material 32 is deposited over the NVM area 18 and the logic area 20. The second layer of gate material 32 is deposited to fill the exposed area over the charge storage stack 30 and covers the charge storage stack 30 with a thick layer. The second layer of gate material 32 can be a metal, a polysilicon, or any combination of the two. The second layer of gate material 32 is deposited using a conventional method, such as, low pressure chemical vapor deposition (LPCVD), plasma-enhanced chemical vapor deposition (PECVD) and the like.

Figure 7:
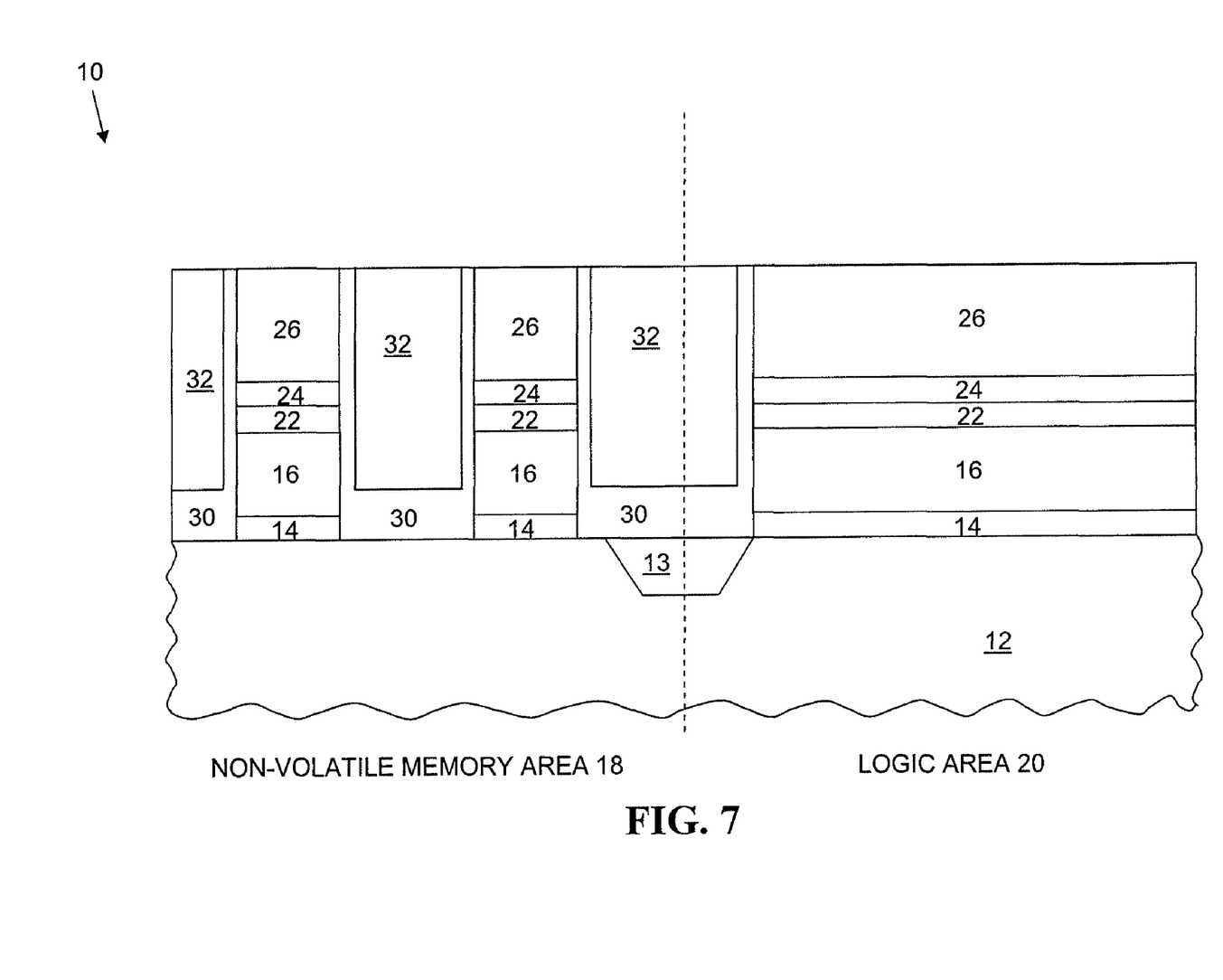
FIG. 7 illustrates the semiconductor device of FIG. 6 after polishing through the second layer of gate material to the polishing stop layer, in accordance with an embodiment of the present invention.

FIG. 7 shows the semiconductor device 10 after polishing of the second layer of gate material 32. The polishing is done to remove the second layer of gate material 32, and the charge storage stack 30 overlying the polishing stop layer 26. The second layer of gate material 32 is polished using conventional techniques, such as, chemical mechanical polishing (CMP). In an embodiment, the second layer of gate material 32 is etched until the polishing stop layer 26 is exposed, by using the conventional etching processes.

Figure 8:
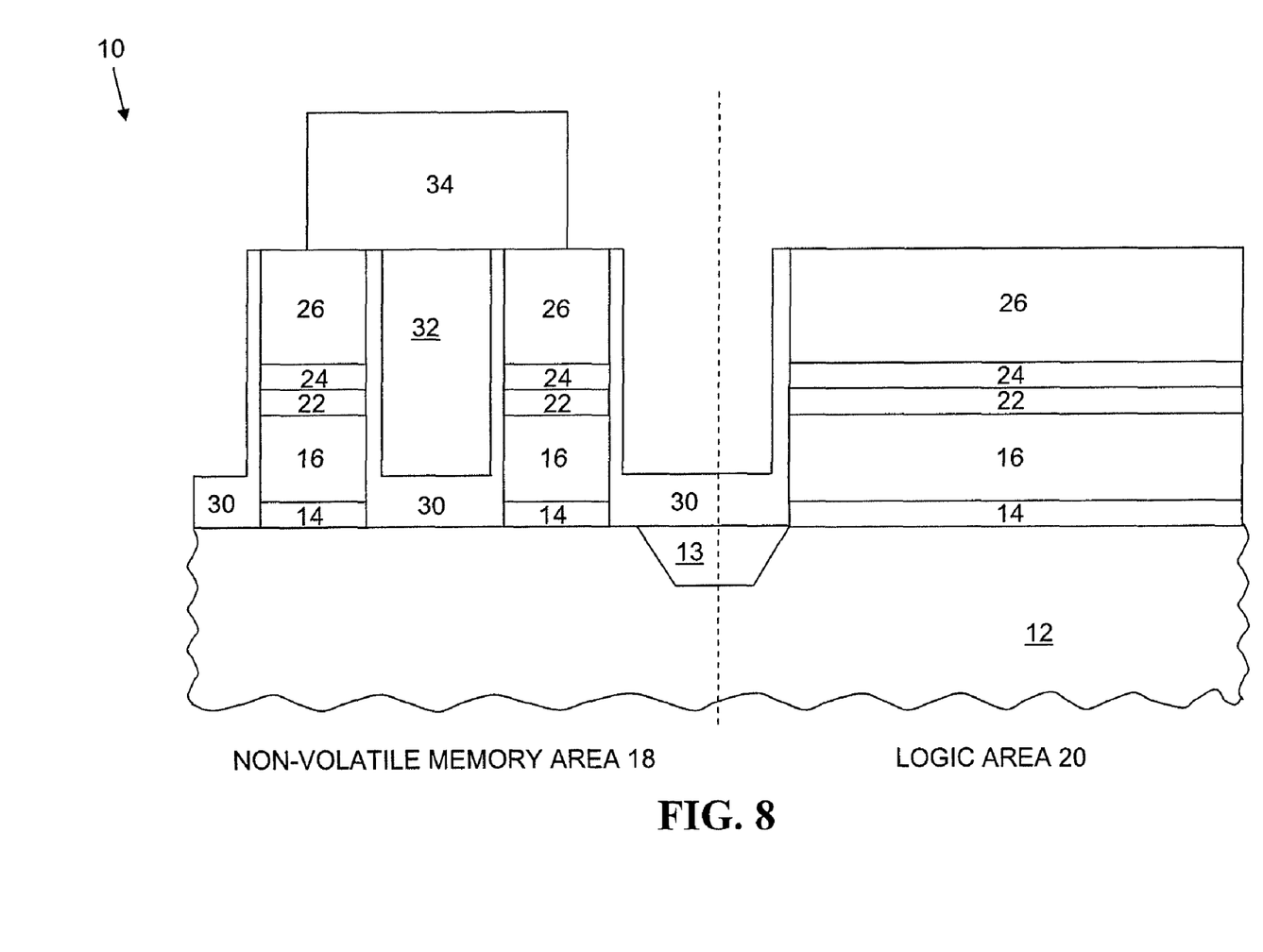
FIGS. 8-11 illustrate the formation of a select gate and a control gate in the NVM area of the semiconductor device of FIG. 7, in accordance with an embodiment of the present invention.

As per FIG. 8, a photoresist mask 34 composed of a photoresist material is deposited. The second layer of gate material 32 is then removed from the exposed area. In one embodiment, the second layer of gate material 32 is removed by using a selective dry etch process, such as, non-isotropic dry etch.

Figure 9:
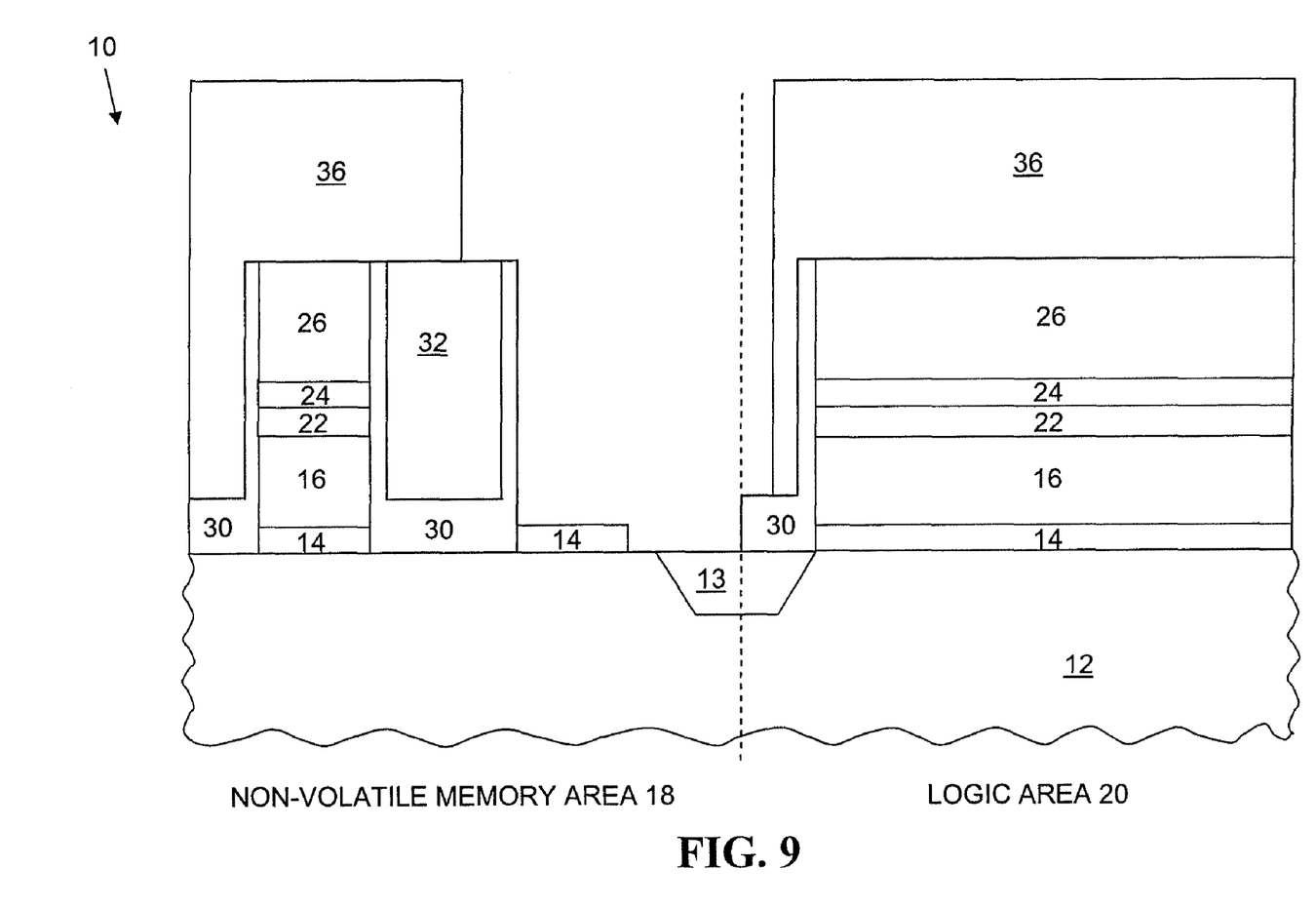

FIG. 9 illustrates a photoresist mask 36 composed of a photoresist material deposited over the semiconductor device 10 of FIG. 8. The exposed area is then etched using the dry etch process. In the process, the exposed polishing stop layer 26, the etch stop layer 24, the ARC layer 22, and the first layer of gate material 16 are removed from the semiconductor device 10 of FIG. 8.

Figure 10:
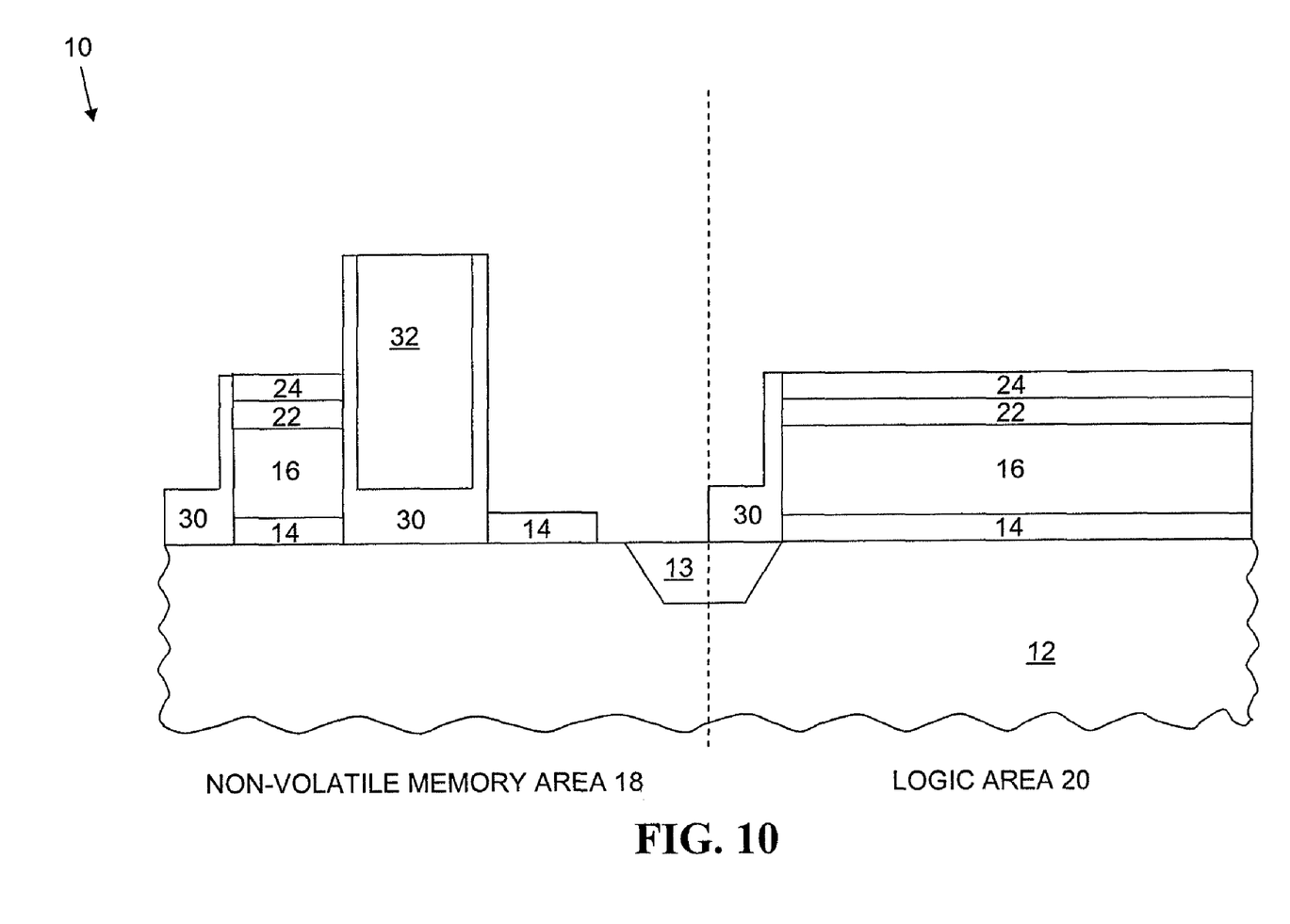

As illustrated in FIG. 10, the polishing stop layer 26 of the semiconductor device of FIG. 9 is selectively etched using a conventional dry etch process, such as, a non-isotropic technique. The dry etching is done in such a way that the second layer of gate material 32 remains unaffected and the polishing stop layer 26 is etched away.

Figure 11:
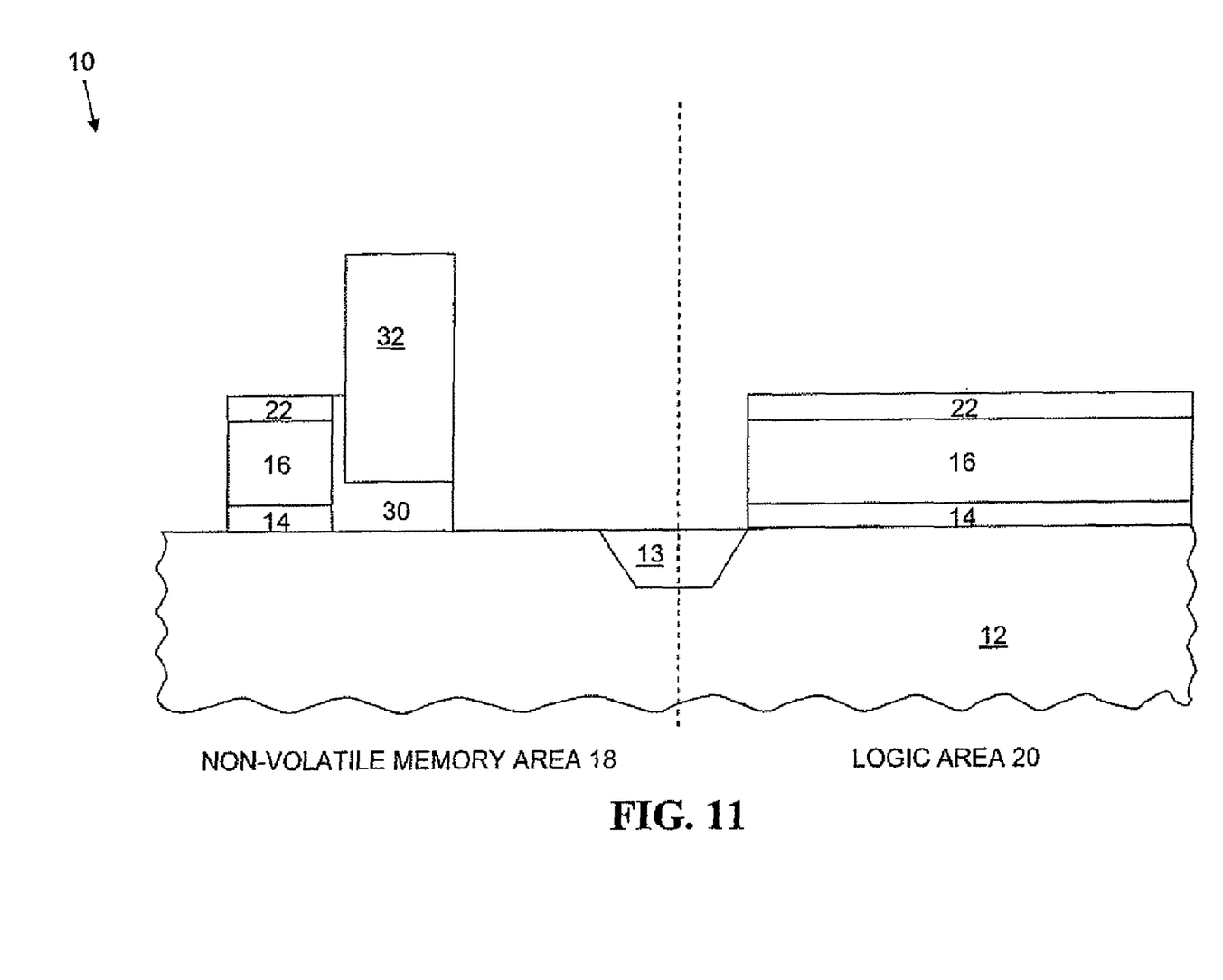

As illustrated in FIG. 11 a wet etching process is performed on the semiconductor device 10 of FIG. 10. In one form the wet etching process is a conventional wet etching process, such as, hydrofluoric (HF) etching. Other acids that can be used for a wet etching process include, but are not limited to, $H_3PO_4$, $H_2SO_4$, KOH, $H_2O_2$, and HCl. The wet etching process leads to removal of the etch stop layer 24, the exposed areas of charge storage stack 30 and the exposed dielectric layer 14. Thus at the completion of the wet etching process, the formation of the select gate and the control gate in the NVM area 18 is complete.

Figure 12:
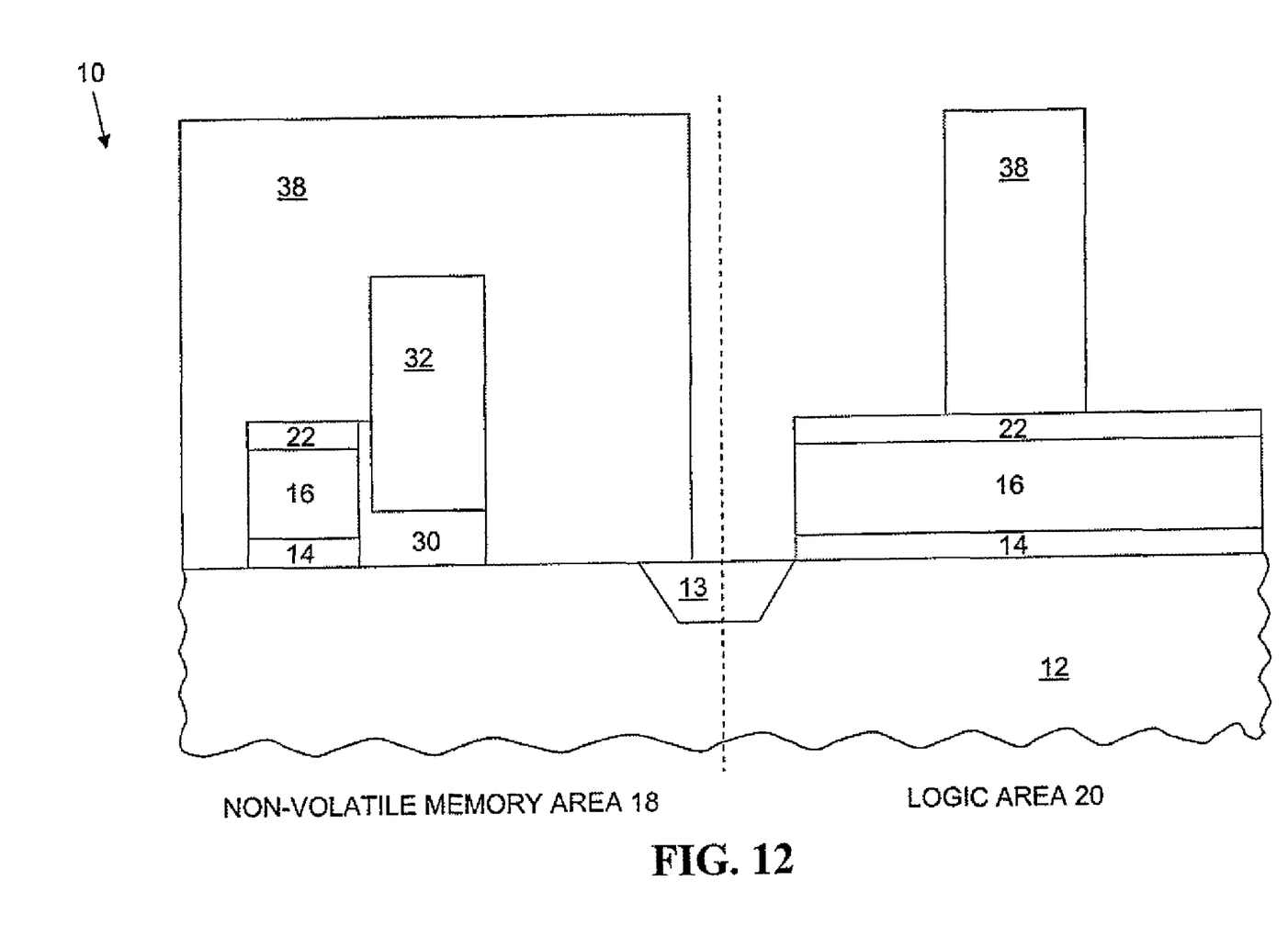
FIG. 12 illustrates the semiconductor device of FIG. 11 after the deposition of a photoresist mask for patterning a gate of a logic transistor in a logic area, in accordance with an embodiment of the present invention.

FIG. 12 illustrates a photoresist mask 38 composed of a photoresist material deposited for patterning the gate of the logic transistor in the logic area 20. Here, the gate of the logic transistor is patterned using the ARC layer 22. The exposed ARC layer 22 and the first layer of gate material 16 are removed from logic area 20 of the semiconductor device 10 of FIG. 11 using a dry etch process.

As the gate of the logic transistor is patterned using the ARC layer 22, the patterning avoids the need to deposit a BARC layer over a gate oxide to pattern the gate of the logic transistor. Moreover, the trench isolation 13 would have to be made large to reduce the non-planarity problem if a BARC layer was deposited. Because the trench isolation 13 between the NVM area 18 and the logic area 20 can be associated with a minimum photolithographic limit, a significant amount of space can be saved on the integrated circuit.

Figure 13:
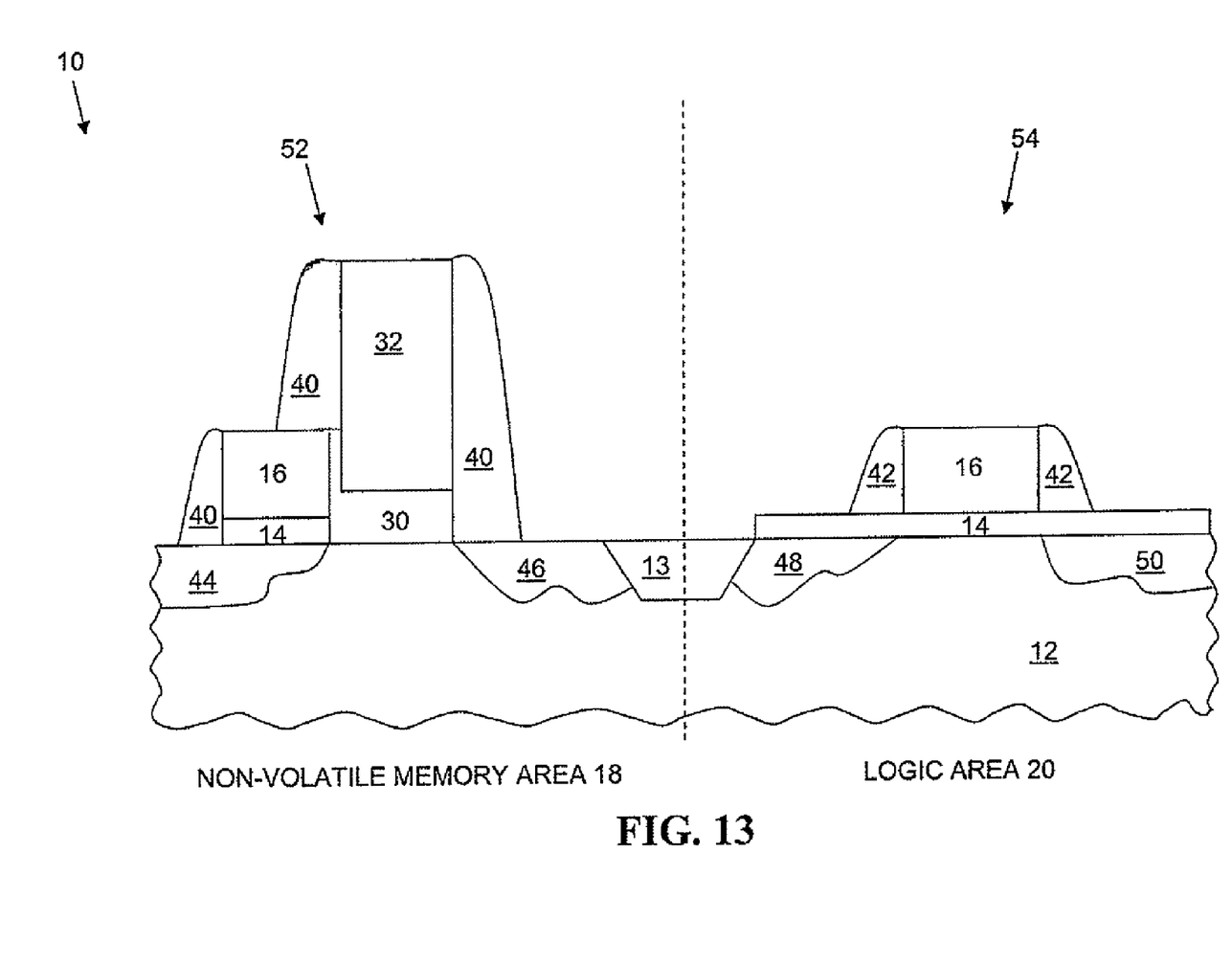
FIG. 13 illustrates the final processing steps for the formation of a memory transistor in a memory area and a logic transistor in a logic area, in accordance with an embodiment of the present invention.

Referring now to FIG. 13, the photoresist mask 38 and the ARC layer 22 are removed from the semiconductor device 10 of FIG. 12. A set of spacers 40, 42 is respectively formed around the first layer of gate material 16 and the second layer of gate material 32 in the NVM area 18, and around the first layer of gate material 16 in the logic area 20. The set of spacers 40, 42 can be formed by depositing an insulating layer, such as, an oxide, a nitride, an oxynitride and the like, over the substrate and etching portions of the insulating layer. A source 44 and a drain 46 for the memory transistor 52 are formed in the NVM area 18. A source 48 and a drain 50 for the logic transistor 54 are formed in the logic area 20. The source 44, 48 and drain 46, 50 are respectively formed by conventional doping process. Thus in the NVM area 18, a memory transistor 52 is formed, and in the logic area 20, a logic transistor 54 is formed. The first layer of gate material 16 acts as a select gate and the second layer of gate material 32 acts as a control gate for the memory transistor 52 in the NVM area 18. The first layer of gate material 16 also acts as a gate for the logic transistor 54 in the logic area 20.

As used herein, the terms NVM area, first defined area and first region represent the memory region and the terms logic area, second defined area and second region represent the logic region in the semiconductor device 10.

As used herein, the terms "first layer of gate material" and "first gate electrode material" represent the select gate in the NVM area 18 as well as the gate electrode in the logic area 20. The terms "second layer of gate material" and "second gate electrode material" represent the control gate in the NVM area 18 which is laterally adjacent the select gate as shown in FIGS. 7-13.

As used herein, the terms "first type of device" and "memory transistor" represent a transistor in the memory area and the terms "second type of device" and "logic transistor" represent a transistor used for performing logic functions in the logic area.

The structures described herein utilize multiple sacrificial layers containing a stack of nitride, oxide, and nitride (ARC layer) to pattern the select gate of a memory transistor in a memory circuit area and a gate electrode of a logic transistor in a logic circuit area. Thus, process complexities in integration of NVM and logic devices are reduced significantly. Instead of using a BARC layer for patterning the gate electrode in the logic area, the present invention uses the ARC layer from the Nitride/Oxide/Nitride stack for this purpose. Due to this, the size of the trench isolation area need not be large which leads to optimal space utilization in the SoC. Further, the present invention enables seamless integration of NVM memories into SoC.

In one form there is herein provided a method for integrating NVM circuitry with logic circuitry by providing a substrate having a first defined area and a second defined area that is electrically separated from the first defined area. A first layer of gate material is provided overlying the substrate in both the first defined area and the second defined area. Multiple adjoining sacrificial layers overlying the first layer of gate material are provided. The multiple adjoining sacrificial layers are provided to form transistor control electrodes in the first defined area wherein at least one of the adjoining sacrificial layers is not completely removed. At least one of the adjoining sacrificial layers is used to pattern a transistor control electrode in the second defined area. Formation of transistors in both the first defined area and the second defined area is completed.

In another form the at least one of the adjoining sacrificial layers is immediately adjacent the transistor control electrode in the second defined area. In another form the multiple adjoining sacrificial layers further include a first nitride layer overlying an oxide layer that overlies a second nitride layer. In another form the first defined area includes a non-volatile memory area for implementing non-volatile memory cells and the second defined area includes a logic area for implementing transistors that implement logic functions. In yet another form the first defined area is electrically isolated from the second defined area by an amount corresponding to a minimum photolithography limit. In yet another form at least one of the multiple adjoining sacrificial layers includes a polishing stop layer for use in chemical mechanical polishing, at least one of the multiple adjoining sacrificial layers includes an etch stop layer for use in chemical etching, and at least one of the multiple adjoining sacrificial layers includes an anti-reflective coating (ARC) layer. In yet another form the multiple adjoining sacrificial layers are completely removed at completion of processing of the first defined area and the second defined area. In one form the multiple adjoining sacrificial layers include an anti-reflective coating (ARC) layer overlying the substrate, an oxide layer overlying the anti-reflective coating layer, and a nitride layer overlying the oxide layer.

In another form there is herein provided a method of forming an integrated circuit including a first region and a second region formed over a substrate and separated by an isolation region. A first gate electrode material layer is formed overlying the substrate in both the first region and the second region. A plurality of sacrificial layers is formed overlying the first gate electrode material layer in both the first region and the second region prior to forming any devices in the first region and the second region. The plurality of sacrificial layers is used to form a first type of device in the first region. At least one of the plurality of sacrificial layers is used to form a second type of device in the second region.

In another form the plurality of sacrificial layers is removed from the first region prior to forming gate electrodes corresponding to the second type of device in the second region. In another form the at least one of the plurality of sacrificial layers is used to form the second type of device immediately adjacent to the first gate electrode material layer. In yet another form the at least one of the plurality of sacrificial layers used to form the second type of device is an anti-reflective coating (ARC) layer. In another form the ARC layer used to pattern a gate electrode corresponding to the second type of device is formed in the second region. In yet another form the plurality of sacrificial layers includes an anti-reflective coating (ARC) layer used to pattern a gate electrode corresponding to the second type of device formed in the second region, a polishing stop layer used to stop polishing of a polysilicon layer formed in both the first region and the second region, and an etch stop layer used to stop etching the polishing stop layer in both the first region and the second region. In yet another form the first region is a memory region and the second region is a logic region. In another form the first type of device includes a control gate and a select gate, and the second type of device includes only one gate.

In yet another form there is provided a method of forming an integrated circuit including a memory region and a logic region formed over a substrate and separated by an isolation region. A first gate electrode material layer is formed overlying the substrate in both the memory region and the logic region. A plurality of sacrificial layers is formed overlying the first gate electrode material layer in both the memory region and the logic region prior to forming any devices in the memory region and the logic region. The plurality of sacrificial layers is used to form a non-volatile memory device in the memory region. At least one of the plurality of sacrificial layers is used to form a logic device in the logic region, wherein the at least one of the plurality of sacrificial layers used to form the logic device is an anti-reflective coating (ARC) layer used to pattern a gate electrode corresponding to the logic region. In another form the plurality of sacrificial layers is removed from the memory region prior to forming the gate electrode corresponding to the logic device in the logic region. In another form the at least one of the plurality of sacrificial layers that is used to form the logic device is immediately adjacent to the first gate electrode material layer. In another form the plurality of sacrificial layers includes a polishing stop layer used to stop polishing of a polysilicon layer formed in both the memory region and the logic region, an etch stop layer used to stop etching the polishing stop layer in both the memory region and the logic region. In yet another form the ARC layer contains nitrogen, the polishing stop layer contains nitrogen, and the etch stop layer contains oxygen.

Note that not all of the activities described above in the general description or the examples are required, that a portion of a specific activity may not be required, and that one or more further activities may be performed in addition to those described. Still further, the order in which activities are listed are not necessarily the order in which they are performed.

Any one or more benefits, one or more other advantages, one or more solutions to one or more problems, or any combination thereof have been described above with regard to one or more specific embodiments. However, the benefits, advantages, solutions to problems, or any elements that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A method comprising:
   providing a substrate having a first defined area for formation of a non-volatile memory cell having a select gate that is laterally adjacent a control gate and having a second defined area that is electrically separated from the first defined area, the second defined area being for formation of a transistor having a gate electrode;
   providing a first layer of gate material overlying the substrate in both the first defined area and the second defined area;
   providing multiple adjoining planar sacrificial layers respectively containing overlying nitrogen, oxygen and nitrogen in both the first defined area and the second defined area and overlying the first layer of gate material;
   using the multiple adjoining planar sacrificial layers to form the select gate and the control gate in the first defined area wherein the nitrogen underlying the oxygen of the multiple adjoining planar sacrificial layers is not completely removed and the oxygen and overlying nitrogen are removed;
   after formation of the select gate and control gate, using the nitrogen layer of the adjoining planar sacrificial layers to pattern the gate electrode of the transistor in the second defined area; and
   completing formation of transistors in both the first defined area and the second defined area.

2. The method of claim 1 wherein the first defined area is electrically isolated from the second defined area by an amount corresponding to a minimum photolithography limit.

3. The method of claim 1 wherein the nitrogen overlying the oxygen of the multiple adjoining planar sacrificial layers functions as a polishing stop layer for use in chemical mechanical polishing, the oxygen of the multiple adjoining planar sacrificial layers functions as an etch stop layer for use in chemical etching, and the nitrogen underlying the oxygen of the multiple adjoining planar sacrificial layers functions as an anti-reflective coating (ARC) layer.

4. The method of claim 1 wherein the multiple adjoining planar sacrificial layers are completely removed at completion of processing of the first defined area and the second defined area and further comprises:
   the nitrogen underlying the oxygen functioning as an anti-reflective coating (ARC) layer overlying the substrate;
   the oxygen functioning as an oxide layer overlying the anti-reflective coating layer; and
   the nitrogen overlying the oxygen functioning as a nitride layer overlying the oxide layer.

5. A method of forming an integrated circuit comprising a first region and a second region formed over a substrate and separated by an isolation region, the method comprising:
   forming a first gate electrode material layer overlying the substrate in both the first region and the second region;
   forming a plurality of planar sacrificial layers respectively comprising overlying layers of nitrogen, oxygen and nitrogen in both the first region and the second region and overlying the first gate electrode material layer in both the first region and the second region prior to forming any devices in the first region and the second region;
   using the plurality of planar sacrificial layers to form a memory cell having a select gate that is laterally adjacent a control gate in the first region, wherein the layers of oxygen and overlying nitrogen of the plurality of planar sacrificial layers are removed; and
   after formation of the select gate and control gate, using the nitrogen that is underlying the oxygen of the plurality of planar sacrificial layers to form a control electrode of a second type of device in the second region.

6. The method of claim 5, wherein the nitrogen underlying the oxygen is used as an anti-reflective coating (ARC) layer.

7. The method of claim 6, wherein the nitrogen underlying the oxygen functions as an anti-reflective coating (ARC) layer overlying the substrate, the oxygen functions as an oxide layer overlying the anti-reflective coating layer, and the nitrogen overlying the oxygen functions as a nitride layer overlying the oxide layer.

8. A method of forming an integrated circuit comprising a memory region and a logic region formed over a substrate and separated by an isolation region, the method comprising:
   forming a first gate electrode material layer overlying the substrate in both the memory region and the logic region;
   forming a plurality of planar sacrificial layers respectively containing overlying layers of nitrogen, oxygen and nitrogen and overlying the first gate electrode material layer in both the memory region and the logic region prior to forming any devices in the memory region and the logic region;
   using the plurality of sacrificial layers to form a non-volatile memory device in the memory region, the non-volatile memory device having a select gate that is laterally adjacent a control gate, wherein the layers of oxygen and overlying nitrogen of the plurality of planar sacrificial layers are removed; and
   using the nitrogen underlying the oxygen of the plurality of planar sacrificial layers to form a logic device in the logic region, wherein the nitrogen underlying the oxygen of the plurality of planar sacrificial layers is used to form a gate electrode of the logic device and functions as an anti-reflective coating (ARC) layer used to pattern the gate electrode.

9. The method of claim 8 further comprising removing the oxygen and the nitrogen overlying the oxygen of the plurality of planar sacrificial layers from the memory region prior to forming the gate electrode of the logic device in the logic region.

10. The method of claim 8, wherein the the oxygen functions as an oxide layer overlying the anti-reflective coating layer, and the nitrogen overlying the oxygen functions as a nitride layer overlying the oxide layer, the oxygen and the nitrogen overlying the oxygen being removed prior to formation of the gate electrode of the logic device.

* * * * *